United States Patent [19]
Gucyski

[11] Patent Number: 5,382,843
[45] Date of Patent: Jan. 17, 1995

[54] ONE OR TWO TRANSISTOR LOGIC WITH TEMPERATURE COMPENSATION AND MINIMIZED SUPPLY VOLTAGE

[76] Inventor: Jeff Gucyski, P.O. Box 11633, Costa Mesa, Calif. 92627

[21] Appl. No.: 224,127

[22] Filed: Apr. 6, 1994

Related U.S. Application Data

[63] Continuation of Ser. No. 818,922, Jan. 13, 1992, abandoned, which is a continuation-in-part of Ser. No. 474,489, Feb. 2, 1990, abandoned.

[51] Int. Cl.$^6$ ............................................. H03K 17/16
[52] U.S. Cl. ................................... 326/109; 326/112; 326/124; 327/543
[58] Field of Search ............... 307/443, 446, 448, 454, 307/559, 561, 565, 310, 296.6, 296.8

[56] References Cited

U.S. PATENT DOCUMENTS

| | | | |
|---|---|---|---|
| 4,242,604 | 12/1980 | Smith | 307/443 |
| 4,340,867 | 7/1982 | Sano | 307/296.8 X |
| 4,350,906 | 9/1982 | Gillberg | 307/561 X |
| 4,473,762 | 9/1984 | Iwahashi et al. | 307/443 X |
| 4,491,747 | 1/1985 | Shimizu | 307/443 X |
| 4,713,560 | 12/1987 | Herndon | 307/446 X |
| 5,023,480 | 6/1991 | Gieseke et al. | 307/451 X |
| 5,045,727 | 9/1991 | Danckaert et al. | 307/448 X |
| 5,065,057 | 11/1991 | Kawasaki | 307/451 X |

Primary Examiner—David R. Hudspeth

[57] ABSTRACT

The logic ensures a smallest achievable propagation delay, lowest achievable supply voltage and low power consumption. Silicon or GaAs can be used. The gain of each gate is preferably low. A local supply voltage E depends on temperature and is provided for each gate or plurality of gates fabricated on a single chip. The main supply voltage V−, whose variations are insignificant, may be as small as −1 V or −0.5 V if bipolar transistors or FETs are used respectively. An inverter may comprise merely one transistor with the source coupled to E. A or a second transistor is coupled between the drain of the first transistor and ground. A binary input voltage is applied to the gate of the first transistor. A binary output voltage appears at the drain and is independent of temperature. An n-input NOR gate is established simply by adding n−1 transistors in parallel with the first transistor.

23 Claims, 4 Drawing Sheets

ONE OR TWO TRANSISTOR LOGIC WITH TEMPERATURE COMPENSATION AND MINIMIZED SUPPLY VOLTAGE

This application is a continuation of application Ser. No. 818,922 filed Jan. 13, 1992, now abandoned, which is a continuation-in-part of application Ser. No. 474,489 filed Feb. 2, 1990, now abandoned.

This invention is related to the following U.S. Patents by the same inventor:

"Capacitive Load Driver with Binary Output" U.S. Pat. No. 5,155,381 dated Oct. 13, 1992;
"Dual Flash Analog-to-Digital Converter" U.S. Pat. No. 5,099,241 dated Mar. 24, 1992;
"Dual Flash Analog-to-Digital Converter" U.S. Pat. No. 5,041,832 dated Aug. 20, 1991;
"Dual Flash Analog-to-Digital Converter" U.S. Pat. No. 5,206,649 dated Apr. 27, 1993;
"Ladderless True Flash Analog-to-Digital Converter with Automatic Calibration" U.S. Pat. No. 5,214,430 dated May 25, 1993;
"Segmented Encoder and Digital Memory Particularly for Flash Analog-to-Digital Converters" U.S. Pat. No. 5,155,489 dated Oct. 13, 1992;
"Ultra Fast Digital-to-Analog Converter with Independent Bit Current Source Calibration" U.S. Pat. No. 4,958,155 dated Sep. 18, 1990;
"High Accuracy Reference Ladder" U.S. Pat. No. 4,929,848 dated May 29, 1990;
"High Speed Integrating Analog-to-Digital Converter" U.S. Pat. No. 4,940,982 dated Jul. 10, 1990;
"Flash Analog-to-Digital Converter with Integrating Input Stage" U.S. Pat. No. 5,173,698 dated Dec. 22, 1992;
"Power Switch Driver" U.S. Pat. No. 4,940,906 dated Jul. 10, 1990;
"Encoder with Error Correction Particularly for Flash Analog-to-Digital Converters" U.S. Pat. No. 5,252,974 dated Oct. 12, 1993;
"Sample-and-Hold Amplifier with Controllable Source Charger" No. 4,980,686 dated Dec. 25, 1990;
"Ultra Fast Logic" U.S. Pat. No. 4,943,740 dated Jul. 24, 1990;
"Analog Power Amplifier" U.S. Pat. No. 4,866,398 dated Sep. 12, 1989;
"High Efficiency Power Amplifier Comprising Multi-level Power Supply" U.S. Pat. No. 4,871,980 dated Oct. 3, 1989;
"High Speed Instrumentation Amplifier with Minimized Offset Voltage and Drift" U.S. Pat. No. 4,829,263 dated May 9, 1989;
"Digital-to-Analog Converter with Digital Correction" U.S. Pat. No. 4,843,392 dated Jun. 27, 1989;
"Flash Analog-to-Digital Converter" U.S. Pat. No. 4,763,106 dated Aug. 9, 1988;
"Dual Flash Analog-to-Digital Converter" U.S. Pat. No. 4,857,931 dated Aug. 15, 1989;
"Digital-to-Analog Converter" U.S. Pat. No. 4,811,017 dated Mar. 7, 1989;
"Digital-to-Analog Converter" U.S. Pat. No. 4,837,572 dated Jun. 6, 1989;
"Operational Amplifier" U.S. Pat. No. 4,749,958 dated Jun. 7, 1988;
"Power Amplifier" U.S. Pat. No. 4,782,306 dated Nov. 1, 1988;
"Operational Amplifier or Comparator Circuit with Minimized Offset Voltage and Drift" U.S. Pat. No. 4,749,953 dated Jun. 7, 1988;
"Operational Amplifier" U.S. Pat. No. 4,714,894 dated Dec. 22, 1987;
"Operational Amplifier" U.S. Pat. No. 4,634,996 dated Jan. 6, 1987; and
"Push-Pull Power Amplifier" U.S. Pat. No. 4,476,441 dated Oct. 9, 1984.

BACKGROUND OF THE INVENTION

The invention relates to an ultra fast logic circuitry, particularly for digital systems requiring extremely fast and complex digital processing, such as microprocessors.

Conventional high speed logic devices are supplied from a supply voltage which is significantly higher than the necessary logic voltage swing. The supply voltage is stabilized and uniform. Very critical are supply voltage ripples which may cause an erroneous operation of the logic components. However, a very noisy supply voltage is inevitable in complex systems. Temperature variations cause a shift of any input threshold level and output voltage level. A temperature compensation, if any, is poor due to a high number of components being balanced. Biasing components contribute to an increased supply voltage and consume a substantial amount of power. An enlarged voltage swing is necessary to increase noise immunity. As a result, on-state collector or drain currents and power dissipation during signal transition period are high. Resistor values are increased to minimize power consumption. However, this causes substantial gate delays even with a relatively short connection length.

Power dissipation is increased whenever an output stage comprises an output transistor having the emitter or collector coupled via a resistor to the power supply rail. Such a pull-up or pull-down resistor requires a small resistance in order to compensate for unequal output rise and fall times. This results in an excessive power dissipation that is proportional to square of the voltage swing. The power dissipation of CMOS and BiCMOS technologies is low at low frequencies but rises dramatically near maximum switching frequency. However, most logic components operate continuously at high frequencies in high speed digital systems. Push-pull output stages are employed as to increase drive capabilities. Such output stages are typical of TTL, CMOS and BiCMOS—common and rather slow logic families. Emitter coupled logic (ECL) has the fastest switching rates and shortest propagation delays of any silicon technology. However, power consumption is very high and some ECL systems require liquid cooling. ECL circuits require a negative supply voltage and another voltage for a terminating resistor return. Current mode logic (CML) is obtained by eliminating the ECL output stage consisting of a transistor and a pull-down resistor. CML has higher speed and lower power consumption. However, a CML loaded gate may have significantly lower switching times due to reduced fan-out and interconnection driving capability. Noise induced on the power supply rail and applied to the input stage is rejected by a differential action thereof. However, the noise applied to the ECL output stage is not cancelled out.

The ECL and CML are based on a differential amplifier principle. Each gate includes a pair of transistors having emitters coupled to a resistor or current source.

The collectors of the transistors are coupled to ground via separate resistors, wherein one transistor is conducting while the other transistor is cut off, i.e., at least two transistors are switched. However, the input signal is applied to only one transistor. The other transistor is used for biasing and is merely capable of providing a complementary output signal. This transistor and current source further demand separate reference voltages and temperature compensation. Up to three levels of series gating are employed for added speed. This requires even more reference voltages. In spite of the laborious biasing, the voltages representing logic levels strongly depend on temperature, supply voltage and individual characteristics of transistors. As a result, an enlarged voltage swing and overblown supply voltage are necessary. The power consumption is remarkably high.

Logic types based on gallium-arsenide (GaAs), in particular direct coupled FET logic (DCFL), offer a better performance at higher cost. The high speed of the GaAs parts is reduced in order to achieve a compatibility with silicon logic families. The speed further deteriorates with increased loads and distances. The GaAs devices usually dissipate a few times less power than comparable ECL devices. However, in real operating conditions the speed is just slightly higher over ECL, i.e., far below the capabilities of GaAs. Moreover, ECL offers significantly higher circuit density at a fraction of the cost.

SUMMARY OF THE INVENTION

The invention is intended to provide a logic having extremely high speed, small power consumption and very low number of components. Transistors of only one conductivity type are used for switching. An adequate voltage regulator is provided for each gate or a plurality of gates fabricated on a single chip. The regulated voltage depends on temperature as to match temperature variations of input and possibly output characteristics of switching transistors. The temperature compensation allows a very small supply voltage which further results in a small power consumption even with small resistor values. Logic levels are independent of the temperature and supply voltage, wherein one logic level is accomplished by a resistor coupled to ground.

The basic circuit comprises an inverter. An n-input NOR gate is accomplished simply by adding n−1 transistors to the inverter, i.e., one transistor for each input. A high input impedance makes possible to drive a relatively large number of gates without a deterioration of gain of the driving gate. If bipolar transistors are employed, the input impedance is particularly high at low input voltage. The output impedance is inherently constant and determined by the resistor coupled to ground. The gain is predetermined and preferably low. This results in highest achievable speed of each switching transistor. For the above reasons, the invention is intended to eliminate the troublesome ECL and take over new technologies thru employment of respective switching components such as GaAs FETs.

A logic apparatus according to the present invention provides a binary output signal in response to a binary input signal and comprises: a reference means for providing a variable reference voltage with reference to ground; a transistor having a gate electrode with the binary input signal applied thereto, a source electrode coupled to the reference voltage, and a drain electrode; and a resistive means coupled between the drain electrode and ground for biasing the transistor, wherein the binary output signal appears across the resistive means.

A bistable logic apparatus according to the present invention comprises: a reference means for providing a variable reference voltage with reference to ground; a pair of transistors of the even conductivity type, each having a gate, source and drain electrodes; a pair of resistive means coupled to ground and further separately coupled to the drain electrodes for biasing the transistors, wherein the gate electrode of each one transistor is coupled to the drain electrode of the other transistor and the source electrodes of the transistors are coupled to the reference voltage, and further wherein a binary input signal is applied across one of the resistive means and a binary output signal appears across one of the resistive means.

BRIEF DESCRIPTION OF THE DRAWINGS

The present invention will become more clear in conjunction with the accompanying figures throughout which similar references may denote similar parts and of which.

DETAILED DESCRIPTION OF THE INVENTION

Figure 1:
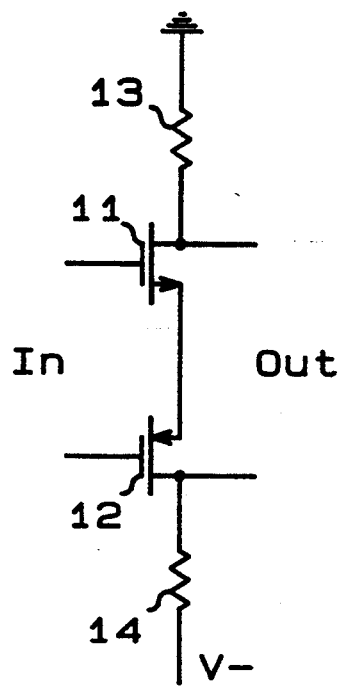
FIG. 1 is the embodiment of an inverter according to the aforementioned "Ultra Fast Logic" U.S. Pat. No. 4,943,740 dated Jul. 24, 1990, by the same inventor.

FIG. 1 is the embodiment of an inverter according to the aforementioned "Ultra Fast Logic" U.S. Pat. No. 4,943,740 dated Jul. 24, 1990, by the same inventor. The inverter comprises a pair of enhancement mode FETs, e.g., MOSFETs, of opposite conductivity types. Specifically, the N-channel FET 11 and P-channel FET 12 have gates coupled to a pair of inputs receiving a differential binary input voltage, sources coupled to each other, and drains coupled to a pair of outputs with a differential binary output voltage appearing thereacross. The drains are further separately coupled to a pair of biasing means. Specifically, the drains of the FETs 11 and 12 are coupled via the resistors 13 and 14 to ground and negative supply voltage V− respectively.

High and low voltages are differential voltages which turn the transistors of the inverter on and off respectively while applied across the inputs thereof. A high or low voltage applied across the inputs of the inverter results in a low or high voltage appearing across the outputs respectively. The high and low voltages are respectively higher and lower than the sum of threshold voltages of the FETs 11 or 12. Moreover, the high input voltage results in a low output voltage which depends on current flowing thru the resistors 13 and 14. The low input voltage cuts the FETs 11 and 12 off, whereby the high output voltage is equal to the supply voltage V−.

This differential signal processing has numerous advantages over the prior art. The supply voltage V− may be very small and uneven throughout a complex logic circuit. Short circuit protection to supply voltage and ground is accomplished. Temperature compensation is inherent. The outputs can be paralleled. Bipolar transistors, preferably Schottky clamped, or FETs can be employed. Each gate requires merely two transistors per input and a pair of equally valued resistors. Ground loop problems are minimal. The noise immunity is high. The resistor values may have small values so that transmission line drive capability and sub-nanosecond processing are accomplished.

Figure 2:
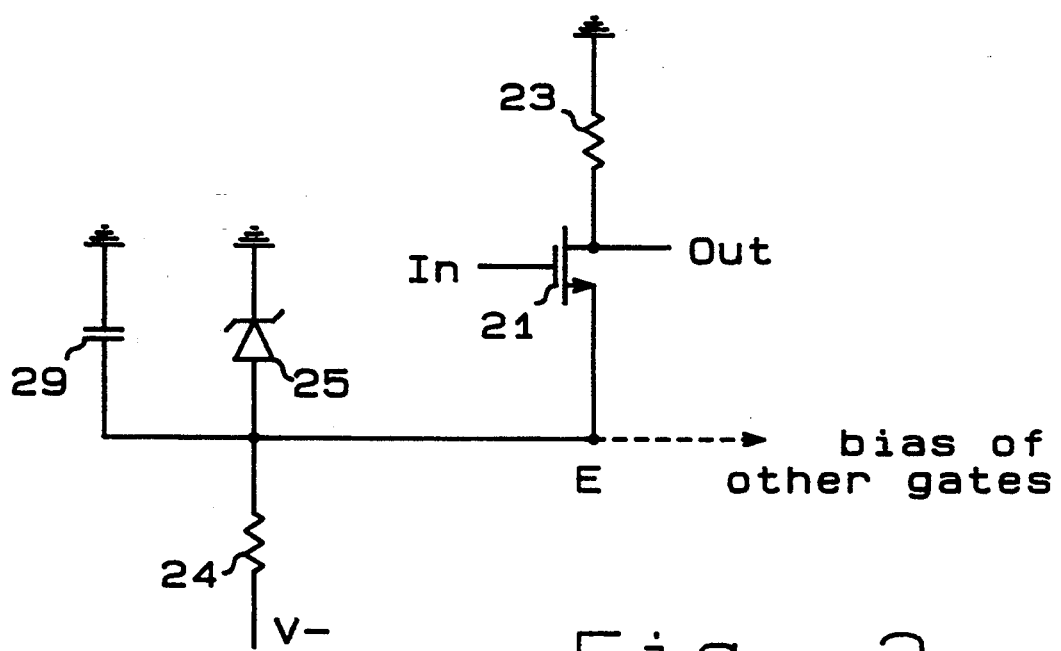
FIG. 2 is the preferred embodiment of basic circuit according to the present invention. An inverter is supplied from a local power supply which provides a temperature dependent reference voltage E. E can be applied to a plurality of gates, as shown in FIGS. 4 and 6.

FIG. 2 is the preferred embodiment of the basic circuit according to the present invention. The main objectives, highest achievable speed and lowest achievable supply voltage, are accomplished by employing merely one switching transistor for each binary input signal. The basic circuit consists of an inverter and reference means. The inverter comprises the switching transistor 21 and resistor 23, and is supplied from the variable reference voltage E rather than fixed supply voltage V−. The reference means produces E which varies as to match temperature variations of input and possibly output characteristics of the transistor 21.

The transistor 21 is an N-channel enhancement mode FET, e.g., silicon MOSFET or GaAs MESFET. Moreover, a bipolar NPN transistor can be employed. The gain of the inverter is predetermined and preferably low so that Schottky clamping of the bipolar transistor is unnecessary. Base, emitter and collector of a bipolar transistor correspond to gate, source and drain of a FET respectively.

The inverter provides a binary output signal in response to a binary input signal. The binary input signal is applied to the gate of the FET 21 and the binary output signal appears at the drain of the same transistor. The reference means provides E with reference to ground. E is applied to the source of the FET 21. The resistor 23 is coupled between the drain of the FET 21 and ground for biasing the FET 21. Accordingly, the binary output voltage appears across the resistor 23.

Figure 4:
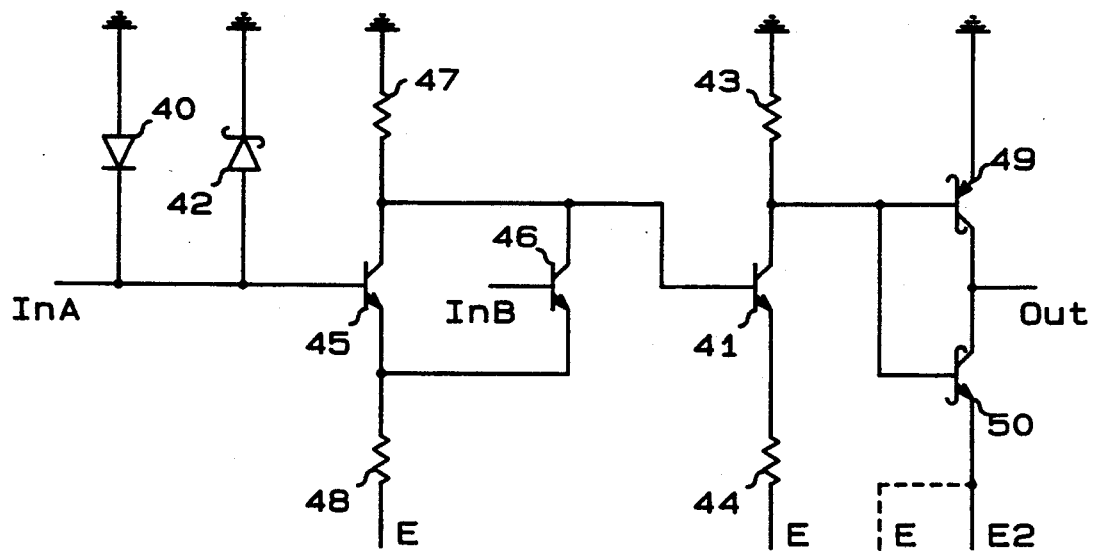
FIG. 4 is an embodiment of a NOR gate implementing bipolar transistors, having an input protection circuit and inverting output buffer.
Figure 6:
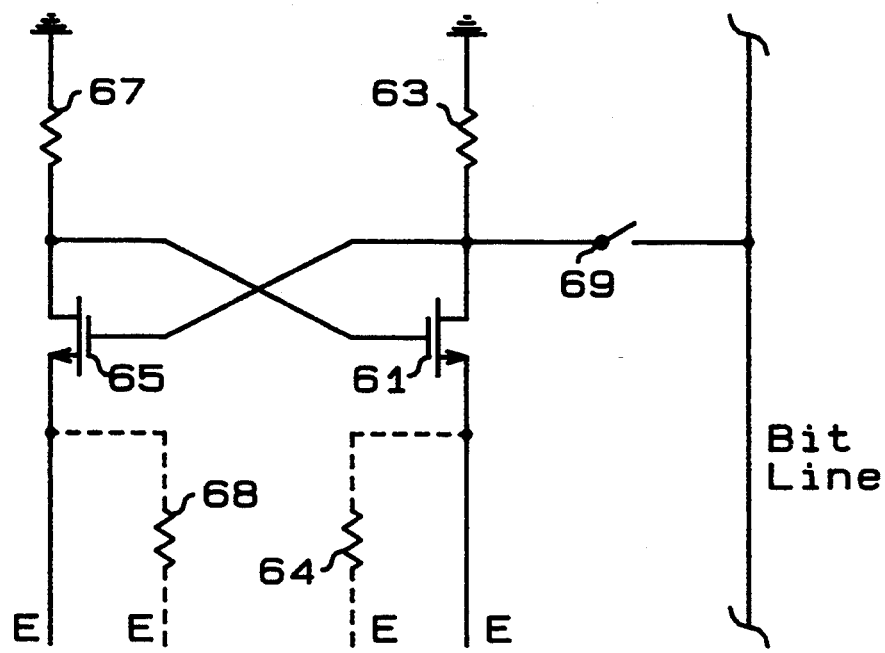
FIG. 6 is an embodiment of a memory cell which can be modified to operate as flip-flop.

The reference means is simply a local power supply or biasing circuit of the inverter. The reference means includes a voltage stabilizer coupled to ground, and a biasing means supplied from the main supply voltage V−. Specifically, the 2-terminal voltage regulator 25 operates as zener diode and develops E which depends on temperature. The regulator 25 determines temperature coefficient of E and is preferably placed on the same chip. The resistor 24 is coupled to V− for biasing the regulator 25. The optional capacitor 29 is coupled thereacross for storing E, whereby noise immunity is very high. The capacitor 29 can be a small, e.g., "parasitic" internal capacitor or, if E is applied to an external pin of an integrated circuit, a large external capacitor. E can be applied to a plurality of gates as shown in FIGS. 4 and 6. The transfer function defines output voltage Vo of the inverter as a function of its input voltage Vi. In order to point out some essential features of the present invention, a simplified model of the FET 21 is assumed. In particular, the FET 21 has a negligible gate current and is shut off if its gate-source voltage is equal to or smaller than its threshold voltage Vth. Vth depends on temperature. The transfer function is given by:

$$Vo = Vo(0) + k\, Vi$$

Moreover, $$0 = Vo(0) + k(Vth + E)$$

where the gain of the gate is $k = -gm\, R3$. $gm$ is the forward transconductance of the FET 21 and R3 is the resistance of the resistor 23. Obviously, k must be smaller than $-1$, e.g., $-1.5$. A small value of k results in highest achievable switching speed of the transistor 21, particularly by minimizing the Miller effect. $Vo(0)$, i.e., Vo at Vi=0, is independent of V−.

High and low input voltages applied to the input of the inverter turn the FET 21 on and off respectively, and result in the low and high voltages appearing at the output respectively. The high and low voltages are equal to zero and Vo(0) respectively. Vo(0) is independent of temperature if $$E = -Vth - Vx$$

−Vx is a fixed negative voltage, wherein $Vo(0) = k\, Vx$. The voltage swing is equal to Vo(0). −Vx is chosen so that when Vi is high, the drain-source voltage Vm is greater than zero and the transistor 21 operates in the linear region over desired temperature range. If a bipolar transistor 21 is used, Vm is greater than its saturation voltage.

$$Vm = Vo(0) - E = Vth + (1+k)Vx$$

The output impedance of the inverter is equal to R3 and thus inherently constant. R3 may be very small due to the minimized supply voltage V− and small voltage swing Vo(0). This results in a minimal power dissipation that is proportional to square of Vo(0). A proper termination of a transmission line can be accomplished. The line drive capability can be increased by employing a buffer as shown in FIG. 4.

The features of the logic according to the present invention are compared with the features of two common fast logic families, as depicted in the following table. In particular, the reference means provides E which is independent of V−. Therefore, V− can have ANY value smaller than an absolute minimum.

TABLE

Ultra Fast Logic vs. ECL and DCFL (GaAs)

| Features | ECL | DCFL | Ultra Fast |
|---|---|---|---|
| Min. supply voltage | −4.5 V | −2 V | −0.5 V |
| Supply voltage accuracy | ±5% | ±5% | ANY |
| No. of switching transistor (2-input NOR) | 3 + 2 | 3 | 2 |
| No. of transistor types | 1 | 2 | 1 |
| Choice of bipolar or FETs | — | — | Y |
| Choice of Si or GaAs | — | — | Y |
| Logic levels indep. of temperature | — | — | Y |
| Logic levels indep. of supply voltage | — | — | Y |
| Fixed output impedance | — | — | Y |
| Paralleling of outputs | Y | — | Y |
| Short circuit prot. to supply voltage | — | Y | Y |
| Transmission line drive capability | Y | — | Y |
| Power dissipation | high | lower | lowest |

TABLE-continued
Ultra Fast Logic vs. ECL and DCFL (GaAs)

| Features | ECL | DCFL | Ultra Fast |
|---|---|---|---|
| Propagation delay | low | low | lowest |

Notes:
1. Y = yes, — = no; and
2. The Ultra Fast Logic ensures smallest achievable propagation delay and lowest achievable supply voltage.

Figure 3:
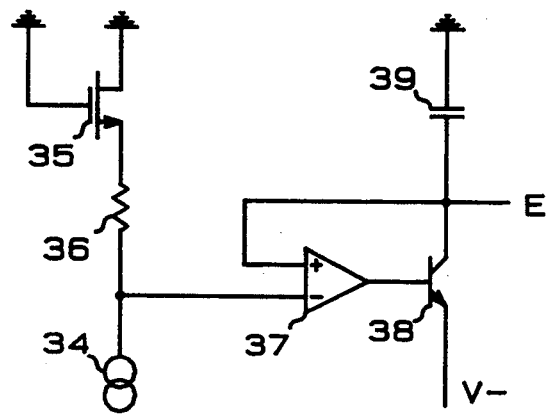
FIG. 3 is an embodiment of a local power supply having high drive capability and allowing a small value of the main supply voltage V−.

FIG. 3 is an embodiment of the reference means having high drive capability and allowing a small value of V—. The reference means is simply a local power supply or biasing circuit. E can be applied to a plurality of gates as shown in FIGS. 4 and 6. The reference means includes a second reference means for providing a second reference voltage. Specifically, the N-channel FET 35 has the gate and drain coupled to ground. The resistor 36 is coupled in series with the source of the FET 35. The current source 34 provides a constant current and constitutes a means for biasing the FET 35. The second reference voltage is equal to —Vg—Vx, where Vg is the gate-source voltage of the FET 35 and Vx is a fixed voltage drop across the resistor 36. Both voltages depend on current of the current source 34. A more complex dependence of the second reference voltage on temperature can be accomplished if the current provided by the current source 34 also varies with temperature.

The reference means further includes an amplifier means for amplifying the second reference voltage and providing E. Specifically, the operational amplifier 37 has the inverting input receiving the second reference voltage, and the noninverting input and output coupled to the collector and base of the NPN transistor 38 respectively. The transistor 38 has the emitter coupled to V— and the collector providing E. The operational amplifier 37 and transistor 38 constitute a voltage follower, i.e., unity gain amplifier. E is equal to the second reference voltage.

The FET 35 and resistor 36 can be used in the voltage regulator 25 of FIG. 2 for determining E. A FET of the opposite conductivity type, i.e., P-channel, can be substituted for the FET 35. A resistor can be coupled in series with one of the inputs of the operational amplifier 37 so that an input bias current thereof causes the desired fixed voltage drop —Vx. The resistor 36 is then superfluous.

The capacitor 39 is coupled between the collector of the transistor 38 and ground, i.e., across the output of the reference means. The capacitor 39 stores E and thereby increases noise immunity. Furthermore, a power supply noise generated by the gate or gates supplied from E is minimized. Obviously, a plurality of capacitors can be employed in various points of an integrated circuit comprising a plurality of gates. Moreover, an external capacitor can be used if E is applied to an external pin of the integrated circuit.

The temperature coefficient of E is determined by the FET 35 that is preferably placed on the same chip. A corresponding integrated circuit may include logic gates and temperature sensor comprising the FET 35, whereas the remaining components can be placed in another integrated circuit. Accordingly, the first integrated circuit is supplied from E rather than V—, whereby its power consumption is minimal. The other integrated circuit operates as an amplifier, possibly voltage follower, which is supplied from V— and provides E in response to the signal from the temperature sensor. Obviously, this integrated circuit may comprise a plurality of such amplifiers each supplied from V— but handling separate input and output signals.

FIG. 4 is an embodiment of 2-input NOR gate implementing bipolar transistors. A means for limiting the binary input signal is connected to one of the inputs, InA. This protection circuit consists of a pair of diodes for applying the binary input signal to ground if the signal is excessive. Specifically, an undershoot and overshoot of the binary input voltage at InA are limited to forward voltages of a fast diode 40 and Schottky diode 42 respectively. If the input voltage exceeds a forward voltage of any diode, that diode applies the input voltage to ground. The input protection circuit also helps to control ringing on long signal lines. The circuit is intended for suppression of transient currents and should not be used as steady-state clamping network in interface applications.

The NOR gate further includes a 2-input NOR gate, inverter and inverting output buffer. The inverter includes the NPN transistor 41 and resistor 43. These components correspond to the FET 21 and resistor 23 of FIG. 2 respectively. Furthermore, the inverter includes the optional resistor 44 for applying the reference voltage to the emitter of the transistor 41. The resistor 44 increases input impedance of the inverter and improves its gain stability over temperature. With a higher value of the resistor 44, the gain is equal to —R3/R4, regardless of the temperature. R3 and R4 are values of the resistors 43 and 44 respectively.

A 2-input NOR gate is established simply by adding a transistor to an inverter. The NPN transistor 45 and resistors 47 and 48 correspond to the components 41, 43 and 44 of the inverter respectively. The NPN transistor 46 is coupled in parallel with the transistor 45, whereby the 2-input NOR gate is established. The binary input signals at the inputs InA and InB are applied to the bases of the transistors 45 and 46 respectively. The signals are NOR-ed, wherein an interim output voltage appears across the resistor 47. This voltage is inverted so that the voltage appearing across the resistor 43 is a result of OR operation of the binary input signals at inputs InA and InB.

The inverting output buffer is employed to increase drive capabilities of the gate. The buffer amplifies the interim binary output voltage appearing across the resistor 43. Specifically, this voltage is applied to the bases of the transistors 49 and 50. The collectors of the transistors provide an amplified binary output signal of the gate. The emitter of the NPN transistor 50 is coupled to the supply voltage E2. The emitter of the PNP transistor 49, i.e., of the opposite conductivity type, is coupled to ground. The transistors 49 and 50 are Schottky clamped as to prevent a saturation thereof. It is essential that the collector-emitter voltage of conducting transistor 49 or 50 is small enough to ensure a proper operation of a following gate.

The buffer is capable of providing a relatively high output current. The buffer is supplied from a separate supply voltage E2 as to minimize power supply noise generation. E2 may be fixed or vary with temperature. In particular, E2 may be equal to the main supply voltage V—. E2 may be also supplied from a separate reference means, such as shown in FIG. 2 or 3. Finally, E2 may be equal to E, as depicted by the dashed line in FIG. 4.

Figure 5:
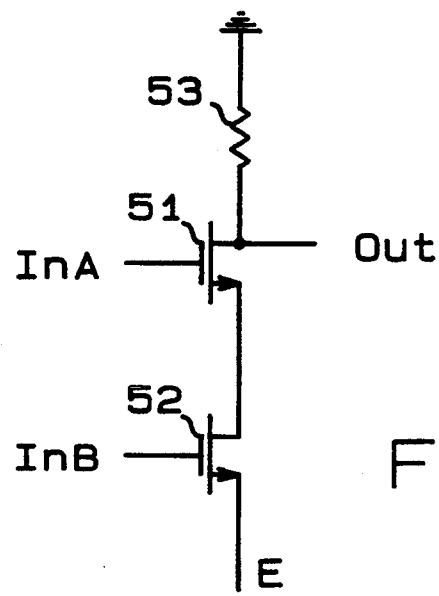
FIG. 5 is an embodiment of a NAND gate.

The embodiment of FIG. 4 also illustrates the method of building complex gates using the basic topology depicted in FIG. 2. Any complex gate can be built using a plurality of NOR gates, wherein an inverter is a single input NOR gate. Furthermore, NAND gates, as shown in FIG. 5, can be employed. FIG. 4 shows individual gates being supplied from a single reference means, not shown for simplicity, which provides E. The reference means may be carried forward from the FIG. 2 or 3 embodiment. The gates, i.e., 2-input NOR gate, inverter and possibly output buffer, must be thermally coupled to one another and further to the temperature sensor of the reference means as to accomplish the temperature compensation.

A new inverter can be added by duplicating the basic structure. The additional binary input signal is applied to the base of an additional transistor. The emitter thereof is coupled to E. The collector of the additional transistor is coupled to ground via an additional resistor. Therefore, the additional transistor is biased by the additional resistor on one side and by E on the other side. Yet another resistor can be added to increase the input impedance and gain stability of the inverter. This resistor is coupled in series with the emitter of the additional transistor for applying E thereto. Assuming that the input InB is inactive, i.e., low, FIG. 4 shows a pair of inverters comprising the transistors 41 and 45 with stabilizing resistors 44 and 48.

An n-input NOR gate is accomplished simply by adding n−1 transistors to the inverter. All transistors are of the even conductivity type and are coupled in parallel. The NPN transistor 45 and resistors 47 and 48 constitute an inverter, similarly to the components 41, 43 and 44 respectively. By coupling the NPN transistor 46 in parallel with the transistor 45, the 2-input NOR gate is established. The transistor 46 represents an additional transistor. The additional binary input signal appearing at the input InB is applied to the base of the transistor 46. The emitter and collector of the transistor 46 are coupled to the emitter and collector of the transistor 45 respectively. The binary input signals at InA and InB are NOR-ed, wherein the interim output voltage appears across the resistor 47.

FIG. 5 is an embodiment of a NAND gate that is based on the inverter topology. Specifically, the N-channel FET 51 and resistor 53 correspond to the FET 21 and resistor 23 of FIG. 2 respectively. The NAND gate further includes at least one additional transistor each having a gate with an additional binary input signal applied thereto, a drain coupled to the source of one transistor, and a source coupled to the drain of another transistor, if any, or otherwise E. FIG. 5 shows one additional transistor. Specifically, the N-channel FET 52 has drain coupled to the source of the FET 51 and source coupled to, since no other transistor is employed, E.

The binary input signals appearing at the inputs InA are InB are applied to the gates of the FETs 51 and 52 respectively. These signals are NAND-ed, wherein the binary output voltage appears across the resistor 53. All transistors are of the even conductivity type and are coupled in series. Therefore, the FETs 51 and 52 conduct the same drain current. A reference means, such as shown in the FIG. 2 or 3 embodiment, provides E.

FIG. 6 is an embodiment of a memory cell. This bistable apparatus includes a pair of inverters each having an input coupled to an output of the other inverter. Specifically, the N-channel FET 61 and resistor 63 correspond to the components 21 and 23 of FIG. 2 respectively. Similarly, the N-channel FET 65 and resistor 67 correspond to the components 21 and 23 of FIG. 2 respectively. The gate and drain of the FET 61 are coupled to the drain and gate of the FET 65 respectively. The sources of the FETs 61 and 65 are coupled to E. Therefore, the reference means, not shown for simplicity, provides E to a plurality of inverters. The reference means may be carried forward from the FIG. 2 or 3 embodiment.

A pair of resistors can be added to increase the gain stability of the individual inverters. The optional resistors 64 and 68 apply E to the sources of the FETs 61 and 65 respectively. The resistors 64 and 68 are especially advantageous when bipolar transistors are substituted for the FETs 61 and 65. The bistable apparatus includes then a pair of inverters as shown in FIG. 4.

The bidirectional switch 69 is coupled between the drain of the FET 61 and Bit Line for selecting the memory cell. The Bit Line is coupled to other memory cells via respective switches. The memory cell is read if the switch 69 is closed and the Bit Line has a high input impedance. The signal appearing at the Bit Line corresponds to the logic state of the cell. The memory cell is written if the switch 69 is closed and the Bit Line has a low output impedance. The signal applied to the Bit Line enforces a gate voltage of the FET 65, whereby the logic state of the cell is determined. When the switch 69 is open, the memory cell retains its logic state.

The connection to the drain of the FET 61 constitutes an input/output terminal, wherein the switch 69 is coupled in series therewith. A binary input voltage is applied across the resistor 63 and a binary output voltage appears across the same resistor. Another switch can be coupled between the drain of the FET 65 and a second Bit Line. Therefore, both switches are separately coupled to the resistors 63 and 67, and both can be unidirectional.

A flip-flop can be established by adding a pair of FETs to the apparatus, whereas the switch 69 is superfluous. The additional FETs are separately coupled in parallel with the FETs 61 and 65. The apparatus consists then of a pair of 2-input NOR gates, as shown in FIG. 4, rather than inverters. The gates of the additional FETs constitute set and reset inputs of the flip-flop.

Figure 7:
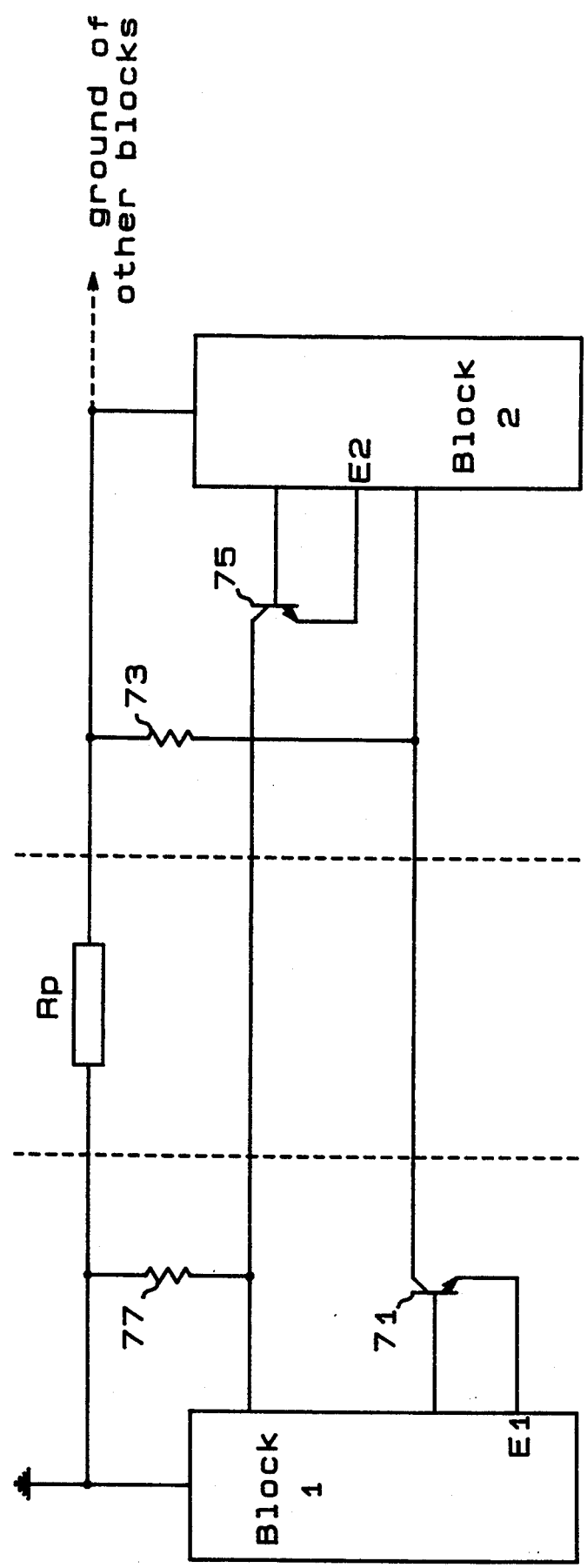
FIG. 7 is a schematic diagram of an interface between two logic blocks referenced to substantially uneven ground potentials.

FIG. 7 is a schematic diagram of an interface between two logic blocks referenced to substantially uneven ground potentials. Specifically, the blocks 1 and 2 are coupled to ground and supplied from the main supply voltage V−. The blocks 1 and 2 comprise logic circuits which draw supply currents. As a result, resistance of printed circuit board traces or conductor strips of an integrated circuit cause voltage drops and thus uneven supply voltages of the blocks. The blocks 1 and 2 comprise reference means, i.e., local power supplies, which produce the reference voltages E1 and E2, respectively, so that the uneven supply voltages are insignificant. Moreover, different values of E1 and E2 are insignificant since the binary output voltages are referenced to ground, have fixed values and are independent of temperature. However, substantially uneven ground potentials must be considered.

In reference to the ground potential of the block 1, the block 2 is referenced to a smaller ground potential. This is caused by the parasitic ground path resistor Rp found between the ground potentials of the blocks 1 and 2, and supply current of the block 2. The respective ground potential difference, i.e., voltage drop across Rp, varies with the supply current of the block 2. Other blocks may be also coupled to the ground potential of the block 2, as depicted by the dashed line in FIG. 7, whereby the voltage drop across Rp also depends on supply currents of these blocks.

Each block comprises a dedicated output inverter for providing an output signal to the other block. The output inverter of block 1 consists of the NPN transistor 71 and resistor 73. Similarly, the output inverter of block 2 consists of the NPN transistor 75 and resistor 77. The emitters of the transistors 71 and 75 are coupled to the reference voltages E1 and E2 respectively. The collectors of the transistors 71 and 75 are coupled to the resistors 73 and 77 respectively.

The resistor 73 is further coupled to the ground potential of the block 2 rather than block 1. Similarly, the resistor 77 is coupled to the ground potential of the block 1 rather than block 2. The transistors 71 and 75 operate as controllable current sources so that the respective binary output voltages appearing across the resistors 73 and 77 are not affected by the voltage drop across the parasitic resistor Rp. The collector-emitter voltage of the transistor 71 is reduced by the voltage drop across Rp. E1 must be large enough to prevent a saturation of the transistor 71. The inverting output buffer of FIG. 4 can be also employed in the interface circuit. The buffer has a low output impedance. A level shifter can compensate for the voltage drop across Rp, if necessary.

The embodiments of the present invention described herein are intended to be taken in an illustrative and not a limiting sense. Various modifications and changes may be made to these embodiments by persons skilled in the art without departing from the scope of the present invention as defined in the appended claims.

I claim:

1. Logic apparatus providing a binary output signal in response to a binary input signal, comprising:
    a reference means for providing a variable reference voltage;
    a transistor having a control electrode, a first current electrode coupled to the reference voltage, and a second current electrode with the binary output signal appearing thereat; and
    a biasing means coupled between the second current electrode and ground for biasing the transistor,
    wherein the binary input signal is applied exclusively to the control electrode and a current conducted between the first and second current electrodes is substantially equal to zero when a voltage between the control electrode and first current electrode is equal to zero, and
    further wherein the reference voltage is substantially independent of the current.

2. Apparatus of claim 1 wherein the reference means includes a second transistor having one electrode coupled to the reference voltage, another electrode coupled to ground and a control electrode coupled to ground.

3. Apparatus of claim 1 wherein the reference means includes:
    a second reference means for providing a second reference voltage; and
    an amplifier means for amplifying the second reference voltage and providing first said reference voltage.

4. Apparatus of claim 3 wherein the amplifier means includes:
    a second transistor having a first electrode with first said reference voltage appearing thereat, and a control electrode; and
    an amplifier having a pair of differential inputs and an output,
    wherein one input is coupled to the second reference voltage, and the other input and output are coupled to the first electrode and control electrode of the second transistor respectively.

5. Apparatus of claim 1 wherein the reference means includes a current source.

6. Apparatus of claim 1 wherein the reference means includes a capacitive means coupled to ground for storing the reference voltage.

7. Apparatus of claim 1 further including a means for limiting the binary input signal.

8. Apparatus of claim 7 wherein the means for limiting includes a diode means for applying the binary input signal to ground when the binary input signal is excessive.

9. Apparatus of claim 1 further including a means for amplifying the binary output signal.

10. Apparatus of claim 9 wherein the means for amplifying includes:
    a second transistor having a control electrode and second current electrode; and
    a third transistor having a first current electrode coupled to ground, a control electrode and second current electrode,
    wherein the control electrodes of the second and third transistors are coupled to the binary output signal and the second current electrodes of the second and third transistors provide an additional binary output signal.

11. Apparatus of claim 9 further including a second reference means for providing a second reference voltage to the means for amplifying.

12. Apparatus of claim 1 further including a second resistive means for applying the reference voltage to the first current electrode.

13. Apparatus of claim 1 further including:
    at least one additional transistor each having a control electrode with an additional binary input signal applied thereto, a first current electrode coupled to the reference voltage, and a second current electrode with an additional binary output signal appearing thereat; and
    at least one additional biasing means each coupled between the second current electrode of one of the additional transistors and ground for biasing the respective additional transistor.

14. Apparatus of claim 13 further including at least one additional resistive means each for applying the reference voltage to the first current electrode of one of the additional transistors.

15. Apparatus of claim 1 further including at least one additional transistor each having a control electrode with an additional binary input signal applied thereto, first and second current electrodes,
    wherein the first and second current electrodes of each additional transistor are coupled to the first and second current electrodes of first said transistor respectively.

16. Apparatus of claim 1 further including at least one additional transistor each having a control electrode with an additional binary input signal applied thereto, a first current electrode coupled to the second current electrode of another additional transistor, if any, or otherwise the reference voltage, and a second current electrode coupled to the first current electrode of yet another additional transistor, if any, or otherwise the first current electrode of first said transistor.

17. Apparatus of claim 1 further including:
a second transistor having a control electrode and second current electrode coupled to the second current electrode and control electrode of first said transistor respectively, and further having a first current electrode coupled to the reference voltage; and
a second biasing means coupled between the second current electrode of the second transistor and ground for biasing the second transistor.

18. Apparatus of claim 1 wherein the biasing means includes a second transistor having one electrode coupled to the second current electrode of first said transistor and another electrode coupled to ground.

19. Apparatus of claim 18 wherein the second transistor has a control electrode coupled to the control electrode of first said transistor.

20. Apparatus of claim 1 wherein the biasing means includes a resistor.

21. Bistable logic apparatus, comprising:
a reference means for providing a variable reference voltage;
a pair of transistors each having a control electrode, first current electrode and second current electrode, with a binary input signal applied to one of the control electrodes and a binary output signal appearing at one of the second current electrodes;
a pair of biasing means coupled to ground and further separately coupled to the second current electrodes for biasing the transistors,
wherein the control electrode of each one transistor is coupled to the second current electrode of the other transistor and the first current electrodes of the transistors are coupled to the reference voltage,
further wherein a current conducted between the first and second current electrodes of each one transistor is substantially equal to zero when a voltage between the control electrode and first current electrode of the same transistor is equal to zero, and
still further wherein the reference voltage is substantially independent of the current.

22. Apparatus of claim 21 further including a pair of resistive means separately coupled to the first current electrodes for applying the reference voltage thereto.

23. Apparatus of claim 21 further including one or two switches each coupled to one of the second current electrodes.

* * * * *